United States Patent
Kim et al.

(10) Patent No.: US 8,872,337 B2
(45) Date of Patent: Oct. 28, 2014

(54) SEMICONDUCTOR PACKAGE AND DISPLAY APPARATUS USING THE SAME

(71) Applicant: Samsung Electronics Co., Ltd., Suwon-si (KR)

(72) Inventors: Young-Deuk Kim, Suwon-si (KR); Ji-Chul Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/106,912

(22) Filed: Dec. 16, 2013

(65) Prior Publication Data

US 2014/0167245 A1    Jun. 19, 2014

(30) Foreign Application Priority Data

Dec. 18, 2012    (KR) .................. 10-2012-0148624

(51) Int. Cl.
  *H01L 27/00*    (2006.01)
  *H01L 23/36*    (2006.01)

(52) U.S. Cl.
  CPC .................................... *H01L 23/36* (2013.01)
  USPC ............................................ 257/737; 257/678

(58) Field of Classification Search
  CPC ............................................. H01L 2224/73204
  USPC .............................................. 257/678, 737
  See application file for complete search history.

(56) References Cited

U.S. PATENT DOCUMENTS

| | | |
|---|---|---|
| 6,677,664 B2 | 1/2004 | Inoue et al. |
| 6,703,702 B2 | 3/2004 | Inoue et al. |
| 7,459,838 B2 | 12/2008 | Kim et al. |
| 7,915,727 B2 | 3/2011 | Choi et al. |
| 2011/0096569 A1 | 4/2011 | Hamada |
| 2012/0026138 A1 | 2/2012 | Imai et al. |

FOREIGN PATENT DOCUMENTS

| | | |
|---|---|---|
| KR | 10-2005-0112762 A | 12/2005 |
| KR | 10-2005-0119420 A | 12/2005 |
| KR | 10-2005-0111830 A | 10/2006 |

*Primary Examiner* — Howard Weiss
*Assistant Examiner* — Tifney Skyles
(74) *Attorney, Agent, or Firm* — Lee & Morse, P.C.

(57) ABSTRACT

A semiconductor package includes a flexible base film having a first surface opposing a second surface, a semiconductor chip mounted on the first surface of the base film, and a touch sensing structure including at least one conductive pattern adjacent to the semiconductor chip. The at least one conductive pattern is disposed through the base film and has a surface exposed at the second surface of the base film. A contact condition of the semiconductor package is determined based on detection of a conductive path between the at least one conductive pattern and a conductive frame or support surface of the semiconductor package. The contact condition provides an indication of heat dissipation that may be expected to occur for the chip during operation.

20 Claims, 14 Drawing Sheets

SEMICONDUCTOR PACKAGE AND DISPLAY APPARATUS USING THE SAME

CROSS-REFERENCE TO RELATED APPLICATION

Korean Patent Application No. 10-2012-0148624, filed on Dec. 18, 2012, and entitled: "Semiconductor Package and Display Apparatus Using the Same," is incorporated by reference herein in its entirety.

BACKGROUND

1. Field

One or more embodiments herein relate to semiconductor packages and displays.

2. Description of the Related Art

The numbers of pixels and signal lines in a display device tend to increase with size and screen resolution. Also, differences in display technologies require different signal line, pixel, and control circuit configurations. In order to meet these needs, various types of semiconductor packages have been developed.

Examples of semiconductor packages include a tape carrier package (TCP), a chip on glass (COG) package, and a chip on film (COF) package. A COF package includes a semiconductor chip, such as a driver IC, mounted on a flexible base film. During assembly, the COF package is disposed at an edge of the display panel where it is fixed and protected by the frame of the display panel. The frame allows heat to be dissipated from the semiconductor package. However, if the semiconductor chip inside the package is misaligned with the frame, the ability of the frame to dissipate heat may be severely compromised.

SUMMARY

In accordance with one embodiment, a semiconductor package includes a flexible base film having a first surface opposing a second surface; a semiconductor chip mounted on the first surface of the base film; and a touch sensing structure including at least one conductive pattern adjacent to the semiconductor chip, the at least one conductive pattern being disposed through the base film and having a surface exposed at the second surface of the base film. The touch sensing structure may be included in an electrical path that determines whether or not the base film contacts a conductive frame supporting the semiconductor package.

Also, the touch sensing structure may include at least one wire on the first surface of the base film, and wherein the at least one wire electrically contacts the at least one conductive pattern.

Also, the semiconductor package may include a detector circuit electrically connected to the at least one wire, wherein the detector circuit determines whether the at least one wire, the conductive pattern, and the frame form a conductive path in order to determine a contact condition between the base film and the frame.

Also, the touch sensing structure may includes a pad on the first surface of the base film, and wherein the pad is electrically connected to the at least one conductive pattern. The pad may be electrically connected to the semiconductor chip, and the semiconductor chip may determine whether or not the pad, the at least one conductive pattern, and the frame form a conductive path, in order to determine a contact condition between the base film and the frame.

Also, the touch sensing structure may include at least two conductive patterns symmetrically disposed relative to the semiconductor chip, and the at least two conductive patterns are disposed through the base film and have surfaces exposed at the second surface of the base film. The semiconductor package may also include a heat sink disposed through the base film and under the semiconductor chip.

Also, the touch sensing structure may determine whether or not a portion of the second surface of the base film adjacent to the semiconductor chip contacts a conductive material.

In accordance with another embodiment, a display apparatus includes a display panel having a front face, a rear face, and a side face; a semiconductor package at least partially surrounding the side face of the display apparatus and contacting the front face and the rear face of the display panel; and a frame surrounding the rear face and the side face of the display panel and covering the semiconductor package. The semiconductor package may include a flexible base film having a first surface opposing a second surface; a semiconductor chip is on the first surface of the base film; and a touch sensing structure including at least one conductive pattern disposed adjacent to the semiconductor chip, the at least one conductive pattern being disposed through the base film and having a surface exposed at the second surface of the base film. The touch sensing structure may determine whether or not a portion of the second surface of the base film adjacent to the semiconductor chip contacts the frame.

Also, the display apparatus may include a detector circuit on the rear face of the display panel, wherein the touch sensing structure is electrically connected to the detector circuit structure by a wire. The detector circuit may determine whether or not the wire, the at least one conductive pattern, and the frame form a conductive path in other to determine a contact condition between the base film and the frame.

Also, the touch sensing structure may include a pad on the first surface of the base film, and wherein the pad is electrically connected to the at least one conductive pattern. The pad may be electrically connected to the semiconductor chip, and the semiconductor chip may determine whether or not the pad, the at least one conductive pattern, and the frame form a conductive path in order to determine a contact condition between the base film and the frame.

Also, the semiconductor package may include a wire on the first surface of the base film, and the semiconductor chip may be electrically connected to the display panel along a conductive path that includes the first wire.

In accordance with another embodiment, a semiconductor package includes a base; a chip coupled to the base; and a touch sensor adjacent the chip. The touch sensor may include a first conductor arranged relative to a bottom surface of the base, and a second conductor arranged relative to the bottom surface of the base. The first and second conductors are adjacent respective sides of the chip, and the first and second conductors are included in electrical paths that provide an indication of a contact condition between the semiconductor package and a conductive support of the semiconductor package.

Also, the first and second conductors are spaced by a distance, and the distance may correspond to an amount of heat to be dissipated from the chip.

Also, the semiconductor package may include a detector in the chip, the detector to detect the contact condition based on a state of the electrical paths including the first and second conductors.

Also, a contact condition of a first side of the semiconductor package may be determined based on a contact condition of the electrical path including the first conductor; and a contact condition of a second side of the semiconductor package may be determined based on a contact condition of the electrical path including the second conductor. The first conductor may be coupled to a first tab of the chip and the second conductor may be coupled to a second tab of the chip, or one or both of the electrical conductors may not be coupled to a lead of the chip. In one embodiment, the electrical paths may be included in a detecting circuit path that bypasses the chip. In another embodiment, the electrical paths may be included in a detecting circuit path that passes through the chip and/or include one or more signal leads of the chip.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
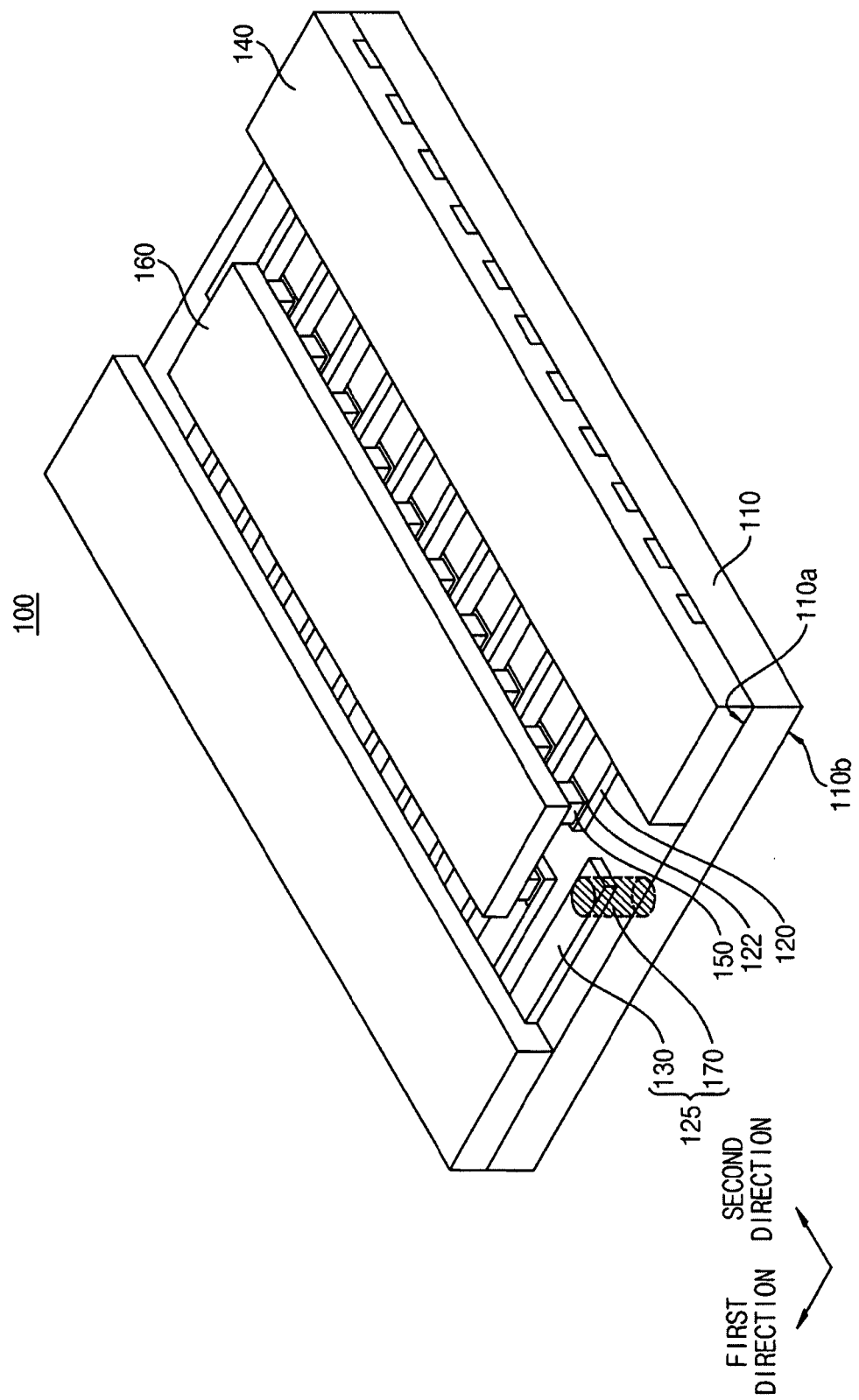
FIG. 1 illustrates an embodiment of a semiconductor package.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
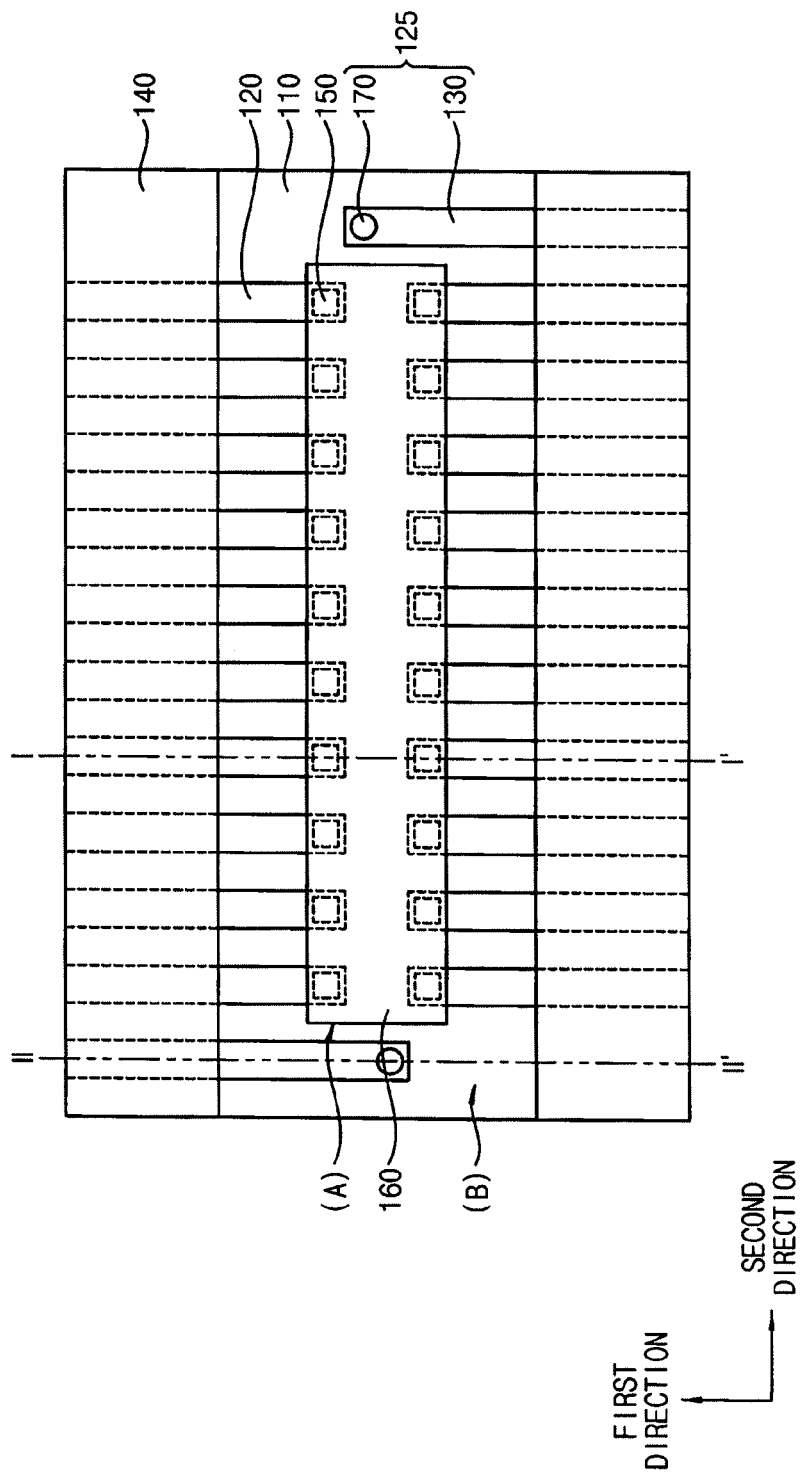
FIG. 2 illustrates a plan view of the semiconductor package of FIG. 1.
Figure 3:
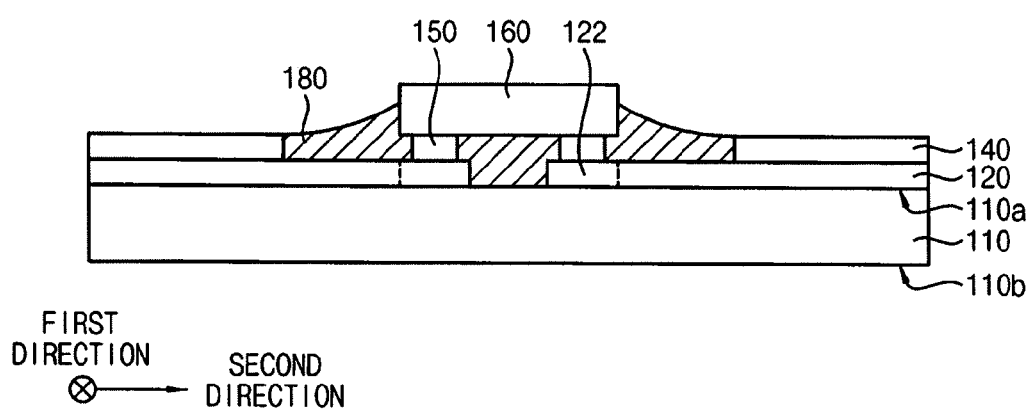
FIG. 3 illustrates a cross-sectional view along the line I-I' of FIG. 2.
Figure 4:
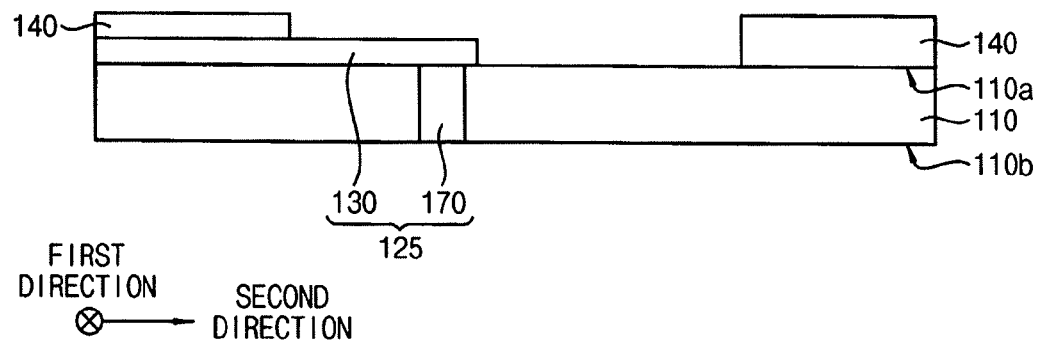
FIG. 4 illustrates a cross-sectional view along the line II-II' of FIG. 2.

FIG. 1 illustrates an embodiment of a semiconductor package 100, FIG. 2 is a plan view of the semiconductor package of FIG. 1, FIG. 3 illustrates a cross-sectional view along the line I-I' of FIG. 2, and FIG. 4 illustrates a cross-sectional view along the line II-II' of FIG. 2.

Referring to FIGS. 1 to 4, a semiconductor package 100 may include a base film 110, a first wiring 120, a touch sensor having a touch sensing structure 125, a protection layer 140, a bump 150, a semiconductor chip 160, and an encapsulation member 180. The touch sensing structure 125 may include a first conductive pattern 170 and a second wiring 130.

The base film 110 may include an insulation material having a predetermined flexibility. For example, the base film 110 may include a polymer such as polyimide. The base film 110 may be divided into a chip region (A) for receiving the semiconductor chip 160 and a peripheral region (B) surrounding the chip region (A) as illustrated in FIG. 2. In example embodiments, the chip region (A) may extend in a second direction. That is, a second edge in the second direction may be substantially longer than a first edge in a first direction, and the first direction may be substantially perpendicular to the second direction. Further, the base film 110 may have a first surface 110a and a second surface 110b, and the first surface 110a may oppose to the second surface 110b.

The first wiring 120 may be disposed on the first surface 110a of the base film 110. In example embodiments, a plurality of first wirings 120 may be arranged in the second direction. Each of the first wirings 120 may extend in the first direction from the chip region (A). In this case, a portion of the first wiring 120 may be disposed in the chip region (A), and the portion may be defined as a first contact end portion 122.

In an example embodiment, the plurality of first wirings 120 may have the same width and the same length as illustrated in FIG. 1. In other example embodiments, the plurality of first wirings 120 may have different width, different length, and/or different distances therebetween. For example, the plurality of first wirings 120 may have different length, and a plurality of first contact end portions 122 may be disposed in a staggered manner.

The second wiring 130 may be disposed on the first surface 110a of the base film 110. In example embodiments, the second wiring 130 may extend in the first direction. In this case, an end portion of the second wiring 130 may be disposed adjacent to the chip region (A). In example embodiments, the second wiring 130 may be symmetrically disposed relative to the chip region (A). The second wiring 130 may have a width substantially the same as that of the first wiring 120, although this is not necessary.

The first wiring 120 and the second wiring 130 may include a conductive material. For example, the first wiring 120 and the second wiring 130 may include copper (Cu), tin (Sn), silver (Ag), nickel (Ni), gold (Au) or an alloy thereof. The first wiring 120 and the second wiring 130 may be formed by forming a metal layer, using for example, Cu, Sn, Ag, Ni, Au or an alloy thereof, through an electrodeposition process or a thermo-compression bonding process, and by patterning the metal layer.

The protection layer 140 may be disposed on the base film 110 to partially cover the first wiring 120 and the second wiring 130. However, the protection layer 140 may not cover the chip region (A) of the base film 110 and portions of the first wiring 120 and the second wiring 130 adjacent to the chip region (A). The protection layer 140 may protect the first wiring 120 and the second wiring 130 to serve, for example, as a solder resist that can prevent corrosion or disconnection of the first and second wirings 120 and 130.

The semiconductor chip 160 may be fixed to the first wiring 120 by the bump 150. In accordance with one embodiment, the semiconductor chip 160 is mounted on the first surface 110a of the base film 110. In example embodiments, one semiconductor chip 160 may be coupled to a plurality of bumps 150.

The bump 150 may include a conductive material such as, for example, Au, Sn, Cu or an alloy thereof. The bump 150 may also serve to fix the semiconductor chip 160 to the first contact end portion 122 by a flip-chip bonding process.

The semiconductor chip 160 may include various types of electrical circuits and components. For example, the semiconductor chip 160 may include any combination of an active element such as a transistor (e.g., a junction transistor, a field-effect transistor, etc.), a diode (e.g., a rectifier diode, a light-emitting diode, a photodiode, etc.), a memory device, or an integrated circuit. Further, the semiconductor chip 160 may include a passive element such as a condenser, a resistor and/or a coil. In an example embodiment, the semiconductor chip may include a driver IC, for example, of a type for controlling a display device.

Referring to FIG. 3, an encapsulation member 180 may be disposed to cover the first wiring 120, the second wiring 130, the bump 150, and the semiconductor chip 160. The encapsulation member 180 may include a polymer material and may be formed by an underfill process. The encapsulation member 180 may stably fix the semiconductor chip 160, and may protect a contact between the semiconductor chip 160 and the first wiring 120.

Referring to FIGS. 1 and 4, the first conductive pattern 170 may be disposed adjacent to the semiconductor chip 160 through the base film 110. Also, the first conductive pattern 170 may contact the second wiring 130. Therefore, the first conductive pattern 170 and the second wiring 130 may constitute the touch sensing structure 125.

In example embodiments, the first conductive pattern 170 may include Au, Sn, Cu or an alloy thereof. Therefore, the first conductive pattern 170 may be electrically connected to the second wiring 130.

The first conductive pattern 170 may be arranged to correspond to the second wiring 130. In one embodiment, two touch sensing structures 125 with two first conductive patterns 170 that correspond to two second wirings 130 may be included as illustrated in FIG. 2. In this embodiment, the first conductive patterns 170 may be spaced apart in the second direction. The distance of the spacing may be determined based on a size of the semiconductor chip 160 and/or a size of the base film or semiconductor package, for example, in order to achieve a certain amount of heat dissipation, as will be described in greater detail below. In other embodiments, the touch sensing structures may be at locations different from those illustrated in FIG. 2.

In one embodiment, the touch sensing structure 125 may determine whether or not the second surface 110b of the base film 110 contacts other conductive material, e.g. a frame (see, e.g., FIGS. 13 and 14) of a display apparatus. If the portion of the second surface 110b of the base film 110 adjacent to the semiconductor chip 160 directly contacts the frame, the frame and the second wiring 130 may be electrically connected by the first conductive pattern 170. That is, the second wiring 130, the first conductive pattern 170, and the frame may form a single conductive path.

Conversely, if the portion of the second surface 110b of the base film 110 adjacent to the semiconductor chip 160 does not directly contact the frame, the frame and the second wiring 130 may be electrically isolated. In this case, the second wiring 130, the first conductive pattern 170, and the frame may not form a conductive path.

Thus, the touch sensing structure 125 may easily determine whether or not the second surface 110b of the base film 110 contacts the frame depending on the formation of the single conductive path.

In example embodiments, the first conductive pattern 170 may have a circular pillar shape as illustrated in FIG. 1. However, the first conductive pattern 170 may have a different shape in other embodiments. For example, the first conductive pattern 170 may have, for example, an elliptical pillar shape, a square pillar shape, a folded conical shape, a folded elliptical conical shape, a folded poly-pyramid shape, or an irregular shape.

Figure 13:
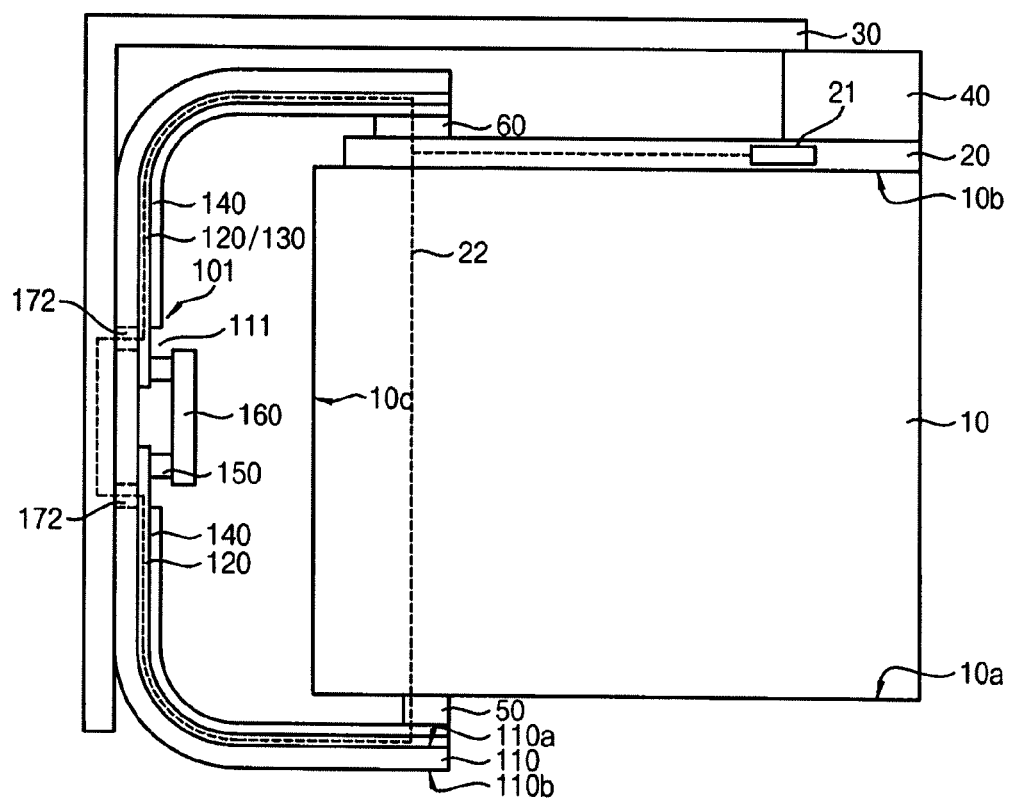
FIGS. 13 and 14 illustrate an embodiment of a display apparatus.
Figure 14:
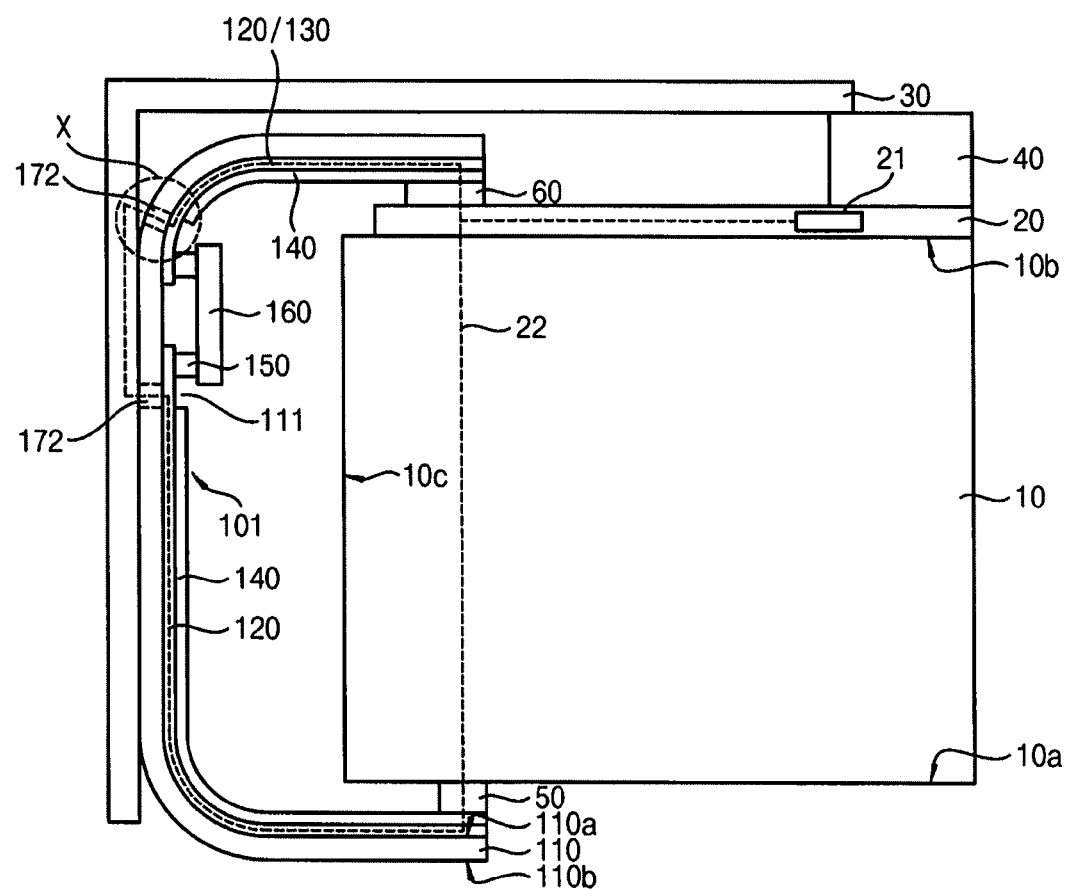

Further, the second wiring 130 may be electrically connected to a circuit substrate 20 (see, for example, FIGS. 13 and 14). The circuit substrate 20 may include a circuit 21 that may judge whether or not the second wiring 130, the first conductive pattern 170, and the frame form the single conductive path. In an embodiment which includes two or more touch sensing structures 125, each structure may be electrically coupled to the circuit structure (e.g., a detector) to judge formation of conductive paths with the frame.

According to example embodiments, the semiconductor package 100 may include the touch sensing structure 125. The touch sensing structure 125 may include the second wiring 130 on the first surface 110a of the base film 110 and the first conductive pattern 170 through the base film 110. The touch sensing structure 125 may be used to determine whether or not the second surface 110b of the base film 110 contacts other conductive material, e.g. the frame of a display apparatus. Therefore, when the semiconductor package 100 is assembled or otherwise applied to the display apparatus, it is easily determined whether or not the semiconductor package 100 is properly arranged in the display apparatus during an assembly process.

Figure 5:
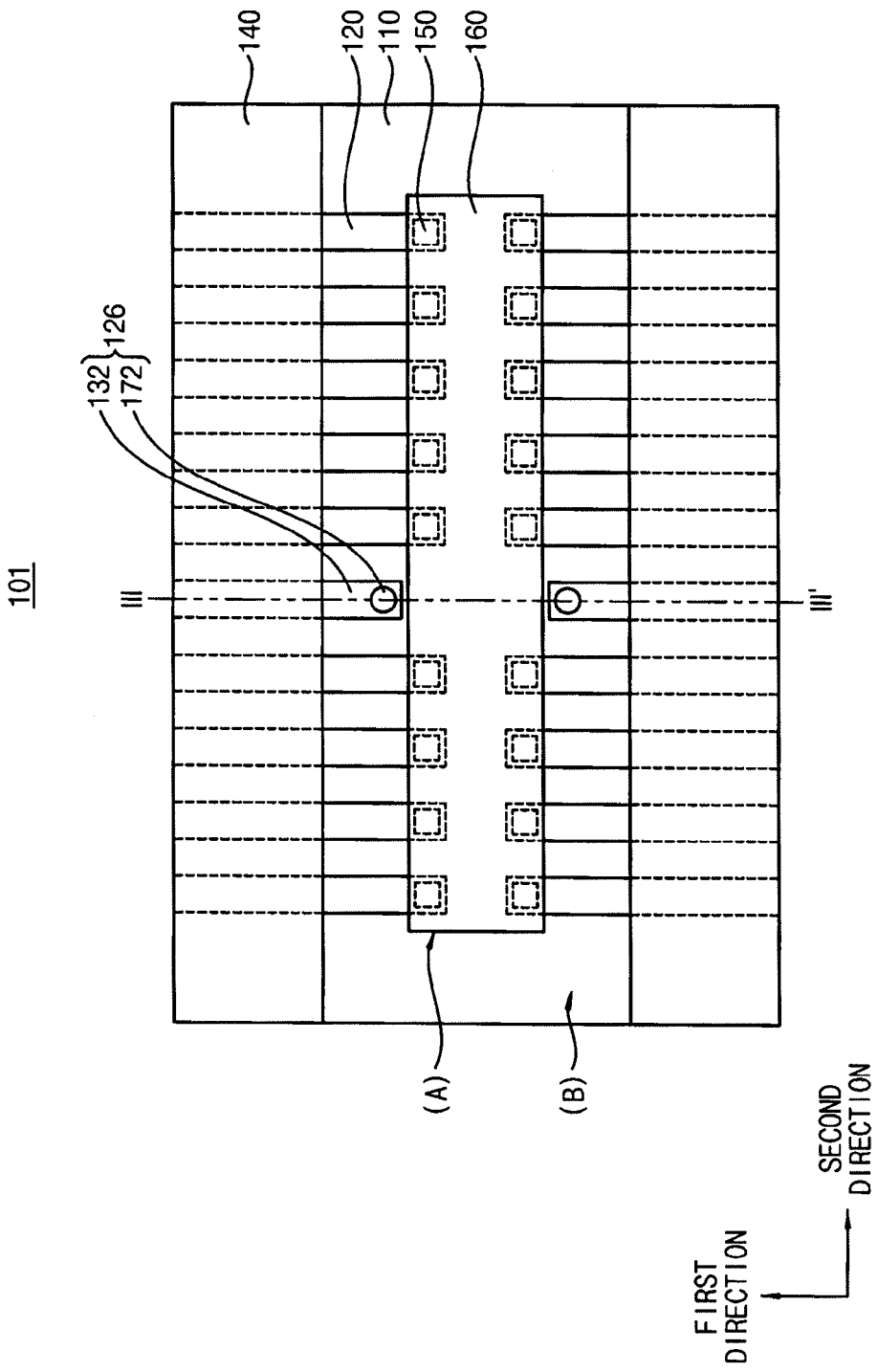
FIG. 5 illustrates another embodiment of a semiconductor package.
Figure 6:
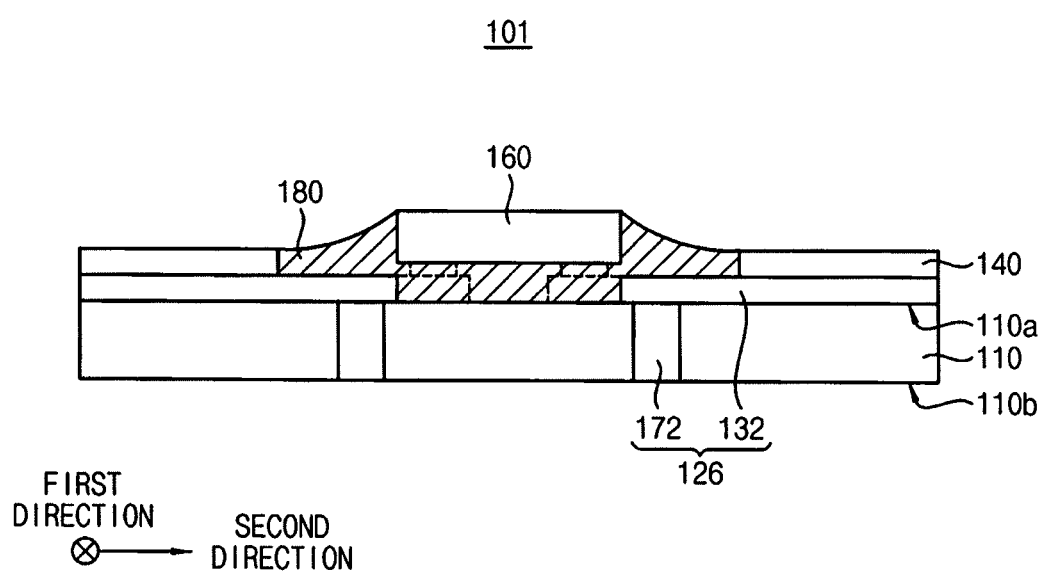
FIG. 6 illustrates a cross-sectional view along the line of FIG. 5.

FIG. 5 illustrates another embodiment of a semiconductor package 101, and FIG. 6 illustrates a cross-sectional view along the line of FIG. 5. The semiconductor package 101 may be substantially the same as or similar to that illustrated in FIGS. 1 to 4, except for a touch sensing structure 126.

Referring to FIGS. 5 and 6, the semiconductor package 101 may include a base film 110, a first wiring 120, the touch sensing structure 126, a protection layer 140, a bump 150, a semiconductor chip 160, and an encapsulation member 180. The touch sensing structure 126 may include a third wiring 132 and a second conductive pattern 172.

The base film 110 may include an insulation material having a predetermined flexibility such as polyimide. The base film 110 may be divided into a chip region (A) for receiving the semiconductor chip 160 and a peripheral region (B) surrounding the chip region (A). Further, the base film 110 may include a first surface 110a and a second surface 110b, and the first surface 110a and the second surface 110 may be opposed to each other.

The first wiring 120 and the third wiring 132 may be disposed on the first surface 110a of the base film 110. In example embodiments, a plurality of first wirings 120 may be arranged in a second direction, and each of the first wirings 120 may extend in a first direction substantially perpendicular to the second direction from the chip region (A). Further, a plurality of third wirings 132 may extend in the first direction, the third wirings 132 may be spaced apart in the first direction.

The protection layer 140 may be disposed on the base film 110 to partially cover the first wiring 120 and the second wiring 130. The semiconductor chip 160 may be fixed to the first wiring 120 by the bump 150, thereby being electrically connected to the first wiring 120.

The second conductive pattern 172 may be disposed through the base film 110 and may be electrically connected to the third wiring 132. In example embodiments, the second conductive pattern 172 may include Au, Sn, Cu or an alloy thereof. Therefore, the third wiring 132 may be electrically connected to the second conductive pattern 172.

The second conductive pattern 172 may be arranged to correspond to the third wiring 132. In one embodiment, a plurality of second conductive patterns 172 may be disposed relative to a plurality of third wirings 132, respectively. The second conductive patterns 172 are spaced apart from each other in the first direction. The spacing between the second conductive patterns may be different from the spacing between the first conductive patterns 170 of FIG. 2, for example, as a result of the location of second conductive patterns. As shown in FIG. 5, the second conductive patterns 172 are located adjacent respective long sides of the semiconductor chip 160, where the first conductive patterns 170 are located adjacent respective short sides of the semiconductor chip.

The touch sensing structure 126 may determine whether or not the second surface 110b of the base film 110 contacts other conductive material, e.g. a frame (see, for example, FIGS. 13 and 14) of a display apparatus. If the portion of the second surface 110b of the base film 110 adjacent to the semiconductor chip 160 directly contacts the frame, the frame and the third wiring 132 may be electrically connected by the second conductive pattern 172. That is, the third wiring 132, the second conductive pattern 172, and the frame may form a single conductive path.

Conversely, if the portion of the second surface 110b of the base film 110 adjacent to the semiconductor chip 160 does not directly contact the frame, the frame and the third wiring 132 may be electrically isolated. As a result, the third wiring 132, the second conductive pattern 172, and the frame may not form a single conductive path. That is, the touch sensing structure 126 may be used to determine whether or not the second surface 110b of the base film 110 contacts the frame depending on the formation of the single conductive path.

Thus, even though the second conductive patterns 172 are spaced apart in the first direction, the touch sensing structure 126 may determine whether or not the second surface 110b of the base film 110 contacts the frame.

Figure 7:
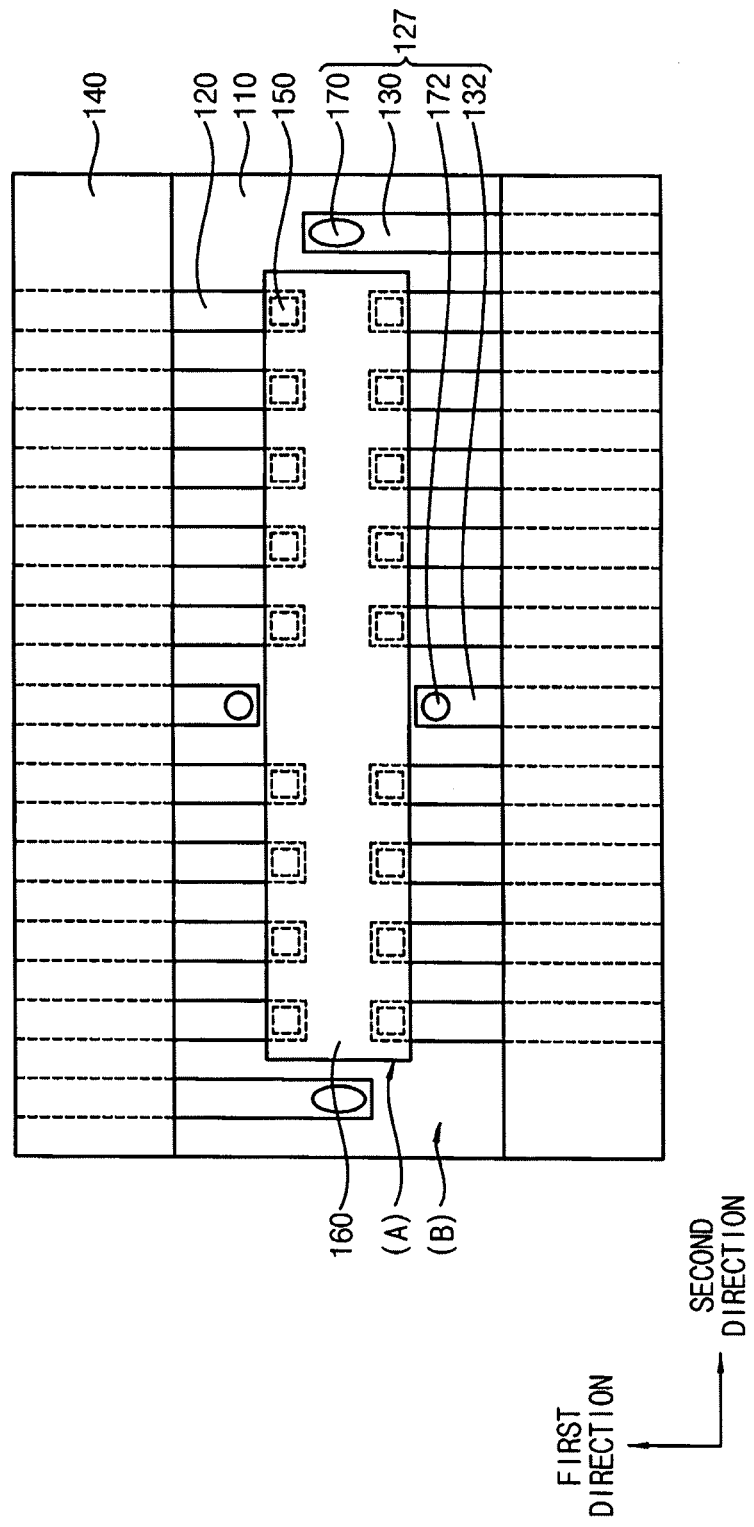
FIG. 7 illustrates another embodiment of a semiconductor package.

FIG. 7 illustrates another embodiment of a semiconductor package 102, which may be substantially the same as or similar to that illustrated with reference to FIGS. 1 to 4 except for a touch sensing structure 127.

Referring to FIG. 7, the semiconductor package 102 may include a base film 110, a first wiring 120, the touch sensing structure 127, a protection layer 140, a bump 150, a semiconductor chip 160, and an encapsulation member 180. Further, the touch sensing structure 127 may include a second wiring 130, a third wiring 132, a first conductive pattern 170, and a second conductive pattern 172.

The first conductive pattern 170 may be electrically connected to the second wiring 130, and the second conductive pattern 172 may be electrically connected to the third wiring 132. The first conductive pattern 170 and the second conductive pattern 172 may be arranged to correspond to the second wiring 130 and the third wiring 132, respectively. In one embodiment, a plurality of first conductive patterns 170 and a plurality of second conductive patterns 172 may be disposed to correspond to a plurality of second wirings 130 and a plurality of third wirings 132, respectively.

In example embodiments, the first conductive patterns 170 may be spaced apart from each other in the second direction, and the second conductive patterns 172 may be spaced apart from each other in the first direction. That is, the first conductive patterns 170 and the second conductive patterns 172 may be disposed to surround the semiconductor chip 160. The touch sensing structure 127 may therefore be used to determine whether or not the second surface 110b of the base film 110 contacts other conductive material, e.g., a frame of a displays device.

Figure 8:
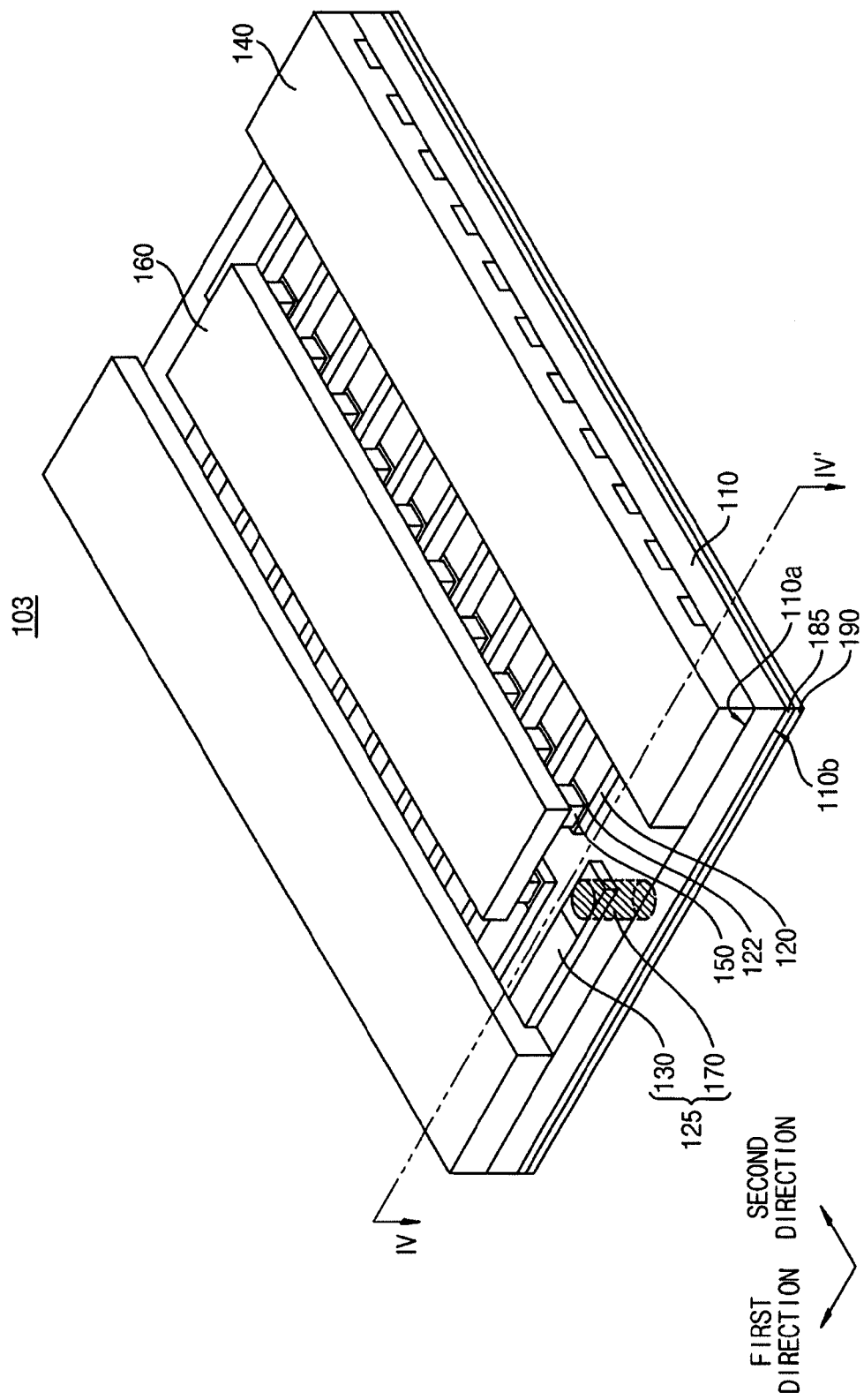
FIG. 8 illustrates another embodiment of a semiconductor package.
Figure 9:
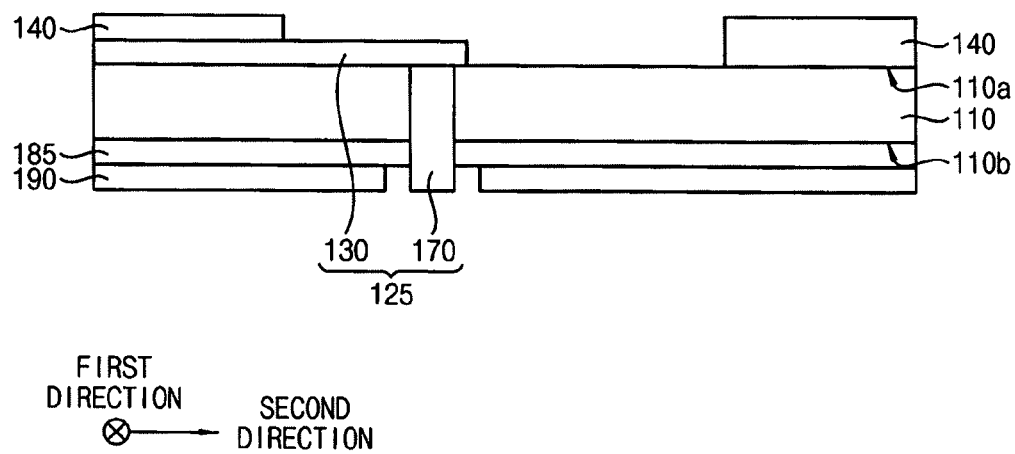
FIG. 9 illustrates a cross-sectional view along the line IV-IV' of FIG. 8.

FIG. 8 illustrates an embodiment of a semiconductor package 103, and FIG. 9 illustrates a cross-sectional view along the line IV-IV' of FIG. 8. The semiconductor package 103 may be substantially the same as or similar to that in FIGS. 1 to 4 except for an adhesive layer 185 and a heat sinking layer 190.

Referring to FIG. 8, the semiconductor package 103 may include a base film 110, a first wiring 120, a touch sensing structure 125, a protection layer 140, a bump 150, a semiconductor chip 160, an adhesive layer 185, and a heat sinking layer 190. Further, the touch sensing structure 125 may include a second wiring 130 and a first conductive pattern 170.

The heat sinking layer 190 may be disposed on a second surface 110b of the base film 110. The heat sinking layer 190 may include a material having a thermal conductivity substantially larger than that of the base film 110. For example, the heat sinking layer 190 may include a metal such as aluminum, copper, gold, tin or an alloy thereof. The heat sinking layer 190 may effectively radiate heat generated in the semiconductor chip 160. The heat may be transferred from the semiconductor chip 160 to the heat sinking layer 190, and then may be dissipated in the air.

Referring to FIG. 9, the heat sinking layer 190 may be spaced apart from the first conductive pattern 170. That is, the heat sinking layer 190 may be electrically isolated from the first conductive pattern 170, and the touch sensing structure 125 and may not be interrupted by the heat sinking layer 190. The adhesive layer 185 may be disposed between the heat sinking layer 190 and the base film 110, and the heat sinking layer 190 may be bonded to the base film 110 by the adhesive layer 185.

In operation, the touch sensing structure 125 may determine whether or not the second surface 110b of the base film 110 contacts other conductive material, e.g., a frame of a displays device. Further, the heat sinking layer 190 may radiate heat generated from the semiconductor chip 160.

Figure 10:
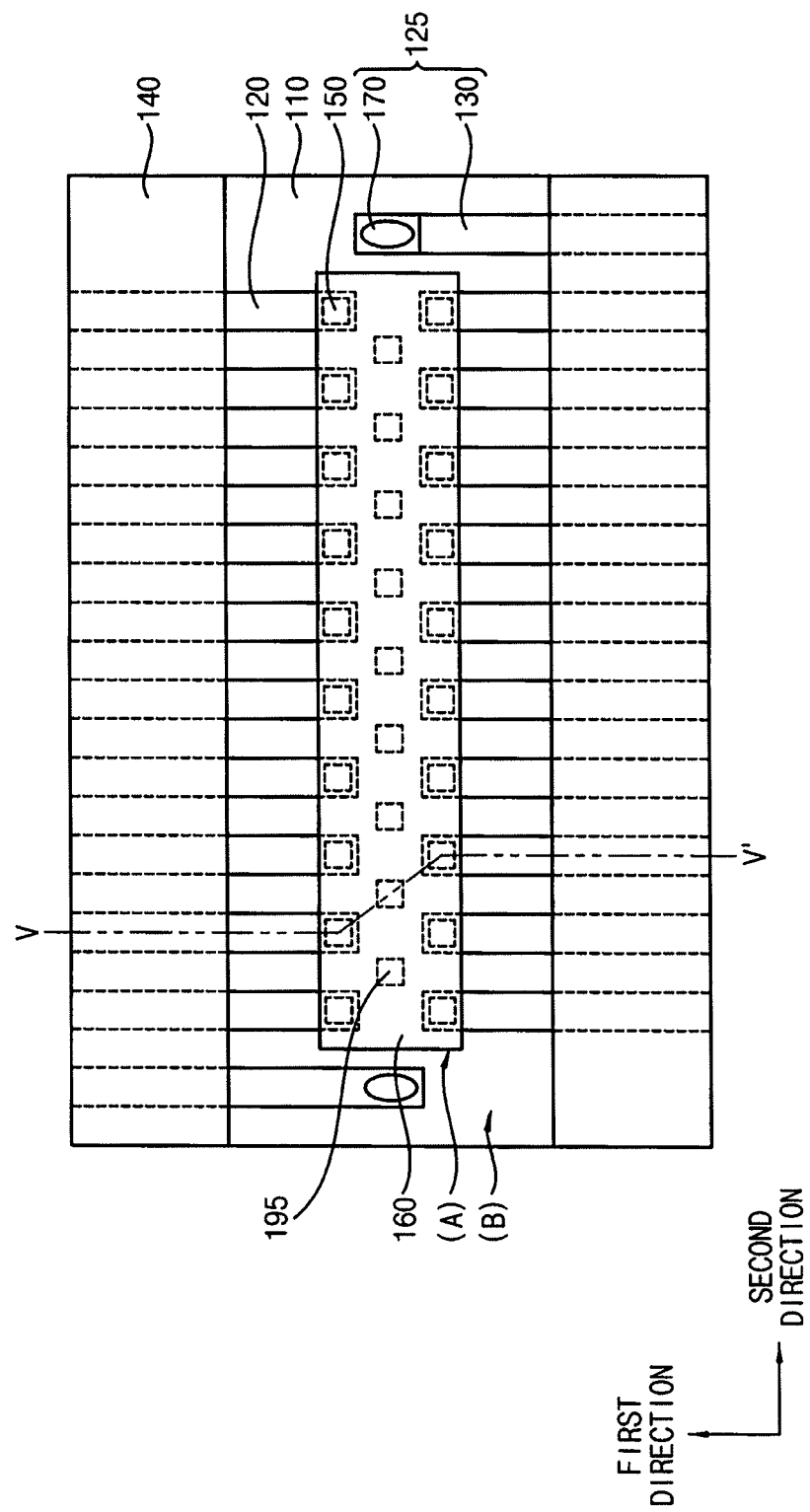
FIG. 10 illustrates another embodiment of a semiconductor package.
Figure 11:
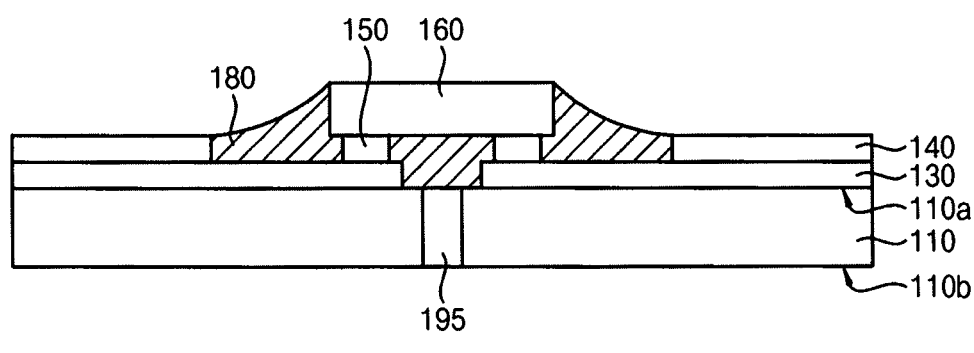
FIG. 11 illustrates a cross-sectional view along the line V-V' of FIG. 10.

FIG. 10 illustrates another embodiment of a semiconductor package 104, and FIG. 11 illustrates a cross-sectional view along the line V-V' of FIG. 10. The semiconductor package 104 may be substantially the same as or similar to that in FIGS. 1 to 4 except for a heat sinking pattern 195.

Referring to FIGS. 10 and 11, the semiconductor package 104 may include a base film 110, a first wiring 120, a touch sensing structure 125, a protection layer 140, a bump 150, a semiconductor chip 160, an encapsulation member 180, and a heat sinking pattern 195. Further, the touch sensing structure 125 may include a second wiring 130 and a first conductive pattern 170.

The heat sinking pattern 195 may be disposed in a chip region (A) through the base film 110. The heat sinking pattern 195 may be electrically isolated from the first and second wirings 120 and 130 and the semiconductor chip 160. Through this electrical isolation, the heat sinking pattern 195 may be prevented from transporting an electrical signal that may distribute operation of the touch sensing structure 125 and the semiconductor chip 160.

The heat sinking pattern 195 may include a material having a thermal conductivity substantially larger than that of the base film 110. For example, the heat sinking pattern 195 may include a metal such as aluminum, copper, gold, tin or an alloy thereof. In an example embodiment, the heat sinking pattern 195 may include a material substantially the same as that of the first conductive pattern 170. The heat sinking pattern 195 may effectively radiate heat generated in the semiconductor chip 160. In example embodiments, the heat sinking pattern 195 and the first conductive pattern 170 may be formed simultaneously.

In operation, the touch sensing structure 125 may determine whether or not the second surface 110b of the base film 110 contacts other conductive material, e.g., a frame of a displays device. Further, the heat sinking pattern 195 may radiate heat generated from the semiconductor chip 160.

Figure 12:
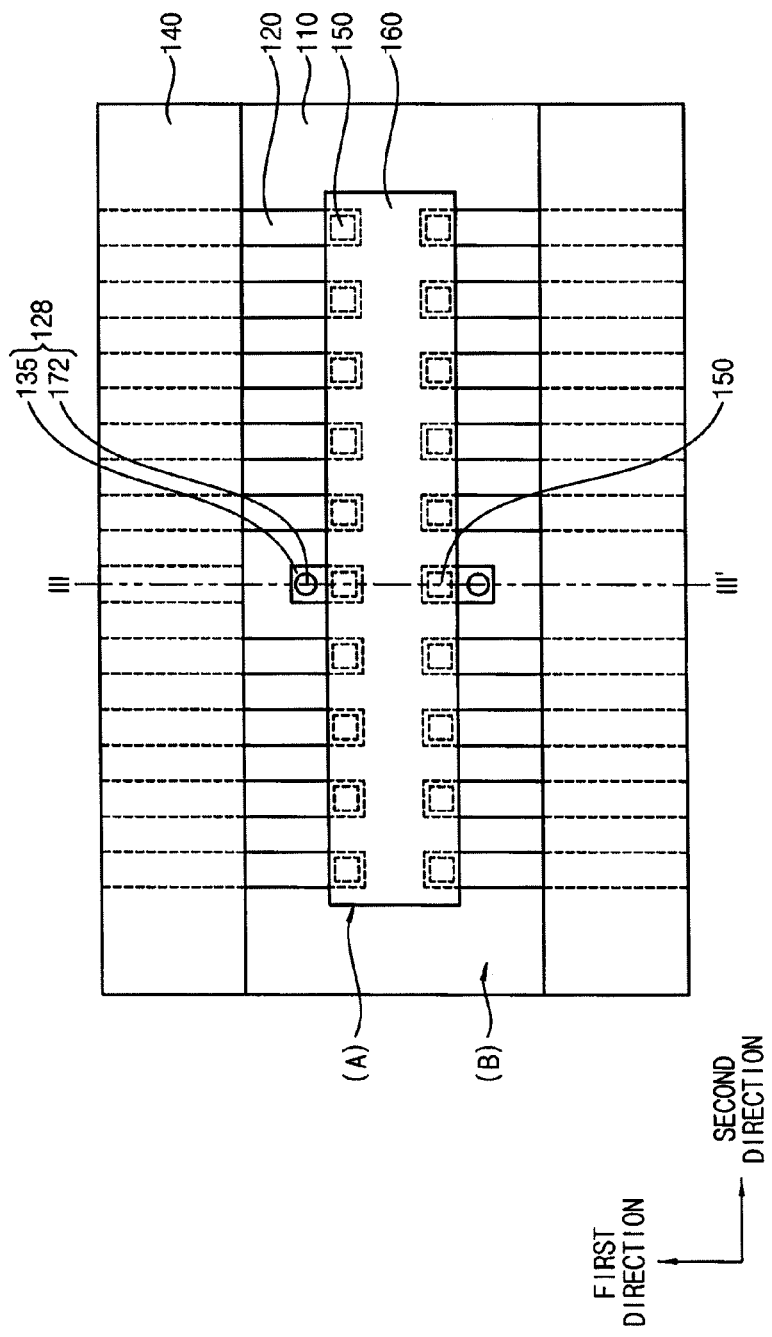
FIG. 12 illustrates another embodiment of a semiconductor package.

FIG. 12 illustrates another embodiment of a semiconductor package 105 which may be substantially the same as or similar to that in FIGS. 5 and 6 except for a pad 135 used in place of a second wiring 130. Referring to FIG. 12, the semiconductor package 105 may include a base film 110, a first wiring 120, a touch sensing structure 128, a protection layer 140, a bump 150, and a semiconductor chip 160. The touch sensing structure 128 may include a pad 135 and a second conductive pattern 172.

The pad 135 may extend in a first direction from a chip region (A). The pad 135 may be disposed to overlap the second conductive pattern 172, thereby being electrically connected to the second conductive pattern 172. In example embodiments, the pad 135 may be electrically connected to the semiconductor chip 160 by the bump 150. That is, the pad 135 may be electrically connected to the second conductive pattern 172 and the semiconductor chip 160.

In example embodiments, the semiconductor chip 160 may determine whether or not the second surface 110b of the base film 110 contacts other conductive material, e.g. a frame (See FIGS. 13 and 14) of a display apparatus. If the portion of the second surface 110b of the base film 110 adjacent to the semiconductor chip 160 directly contacts the frame, the frame and the pad 135 may be electrically connected by the second conductive pattern 172. That is, the semiconductor chip 160, the bump 150, the pad 135, the second conductive pattern 172, and the frame may form a single conductive path.

Conversely, if the portion of the second surface 110b of the base film 110 adjacent to the semiconductor chip 160 does not directly contact the frame, the frame and the pad 135 may be electrically isolated. In this case, the pad 135, the semiconductor chip 160, the second conductive pattern 172, and the frame may not form a single conductive path. That is, the semiconductor chip 160 and the touch sensing structure 125 may be used to determine whether or not the second surface 110b of the base film 110 contacts the frame depending on whether a single conductive path us formed.

FIGS. 13 and 14 illustrate cross-sectional views of an embodiment of a display apparatus. FIG. 13 is a cross-sectional view corresponding to when a semiconductor package is properly arranged. FIG. 14 a cross-sectional view corresponding to when a semiconductor package is not properly arranged. In FIG. 14, area X shows only one of two second conductive patterns 172 that does not electrically contact frame 30. Thus, in FIG. 14, an electrical path is not formed between the second conductive pattern 172 and a detector circuit 21, indicating an improper arrangement.

Referring to FIGS. 13 and 14, the display apparatus may include a display panel 10, a circuit substrate 20, a frame 30, and a semiconductor package 101.

The display panel 10 may be any one of a variety of flat display panels, including but not limited to a liquid crystal display panel, an organic light emitting diode display panel, or a plasma display panel. The display panel 10 may have a front face 10a for displaying an image, a rear face 10b opposing to the front face 10a, and a side face 10c.

The circuit substrate 20 may be disposed on the rear face 10b of the display panel 10. The circuit substrate 20 may include a driving circuit for controlling the display apparatus. Further, the circuit substrate 20 may include a circuit coupled to a touch sensing structure of the semiconductor package 20. The touch sensing structure may be in accordance with any of the aforementioned embodiments described herein.

The frame 30 may be bonded to the rear face 10b of the display panel 10 by an adhesive member 40. The frame 30 may be disposed to surround the rear face 10b and the side face 10c of the display panel 10. The frame 30 may include a conductive material, for example, having a relatively high thermal conductivity such as aluminum (Al), magnesium (Mg), or stainless steel (SUS). The frame 30 may support and protect the display panel 10 and the circuit substrate 20.

The semiconductor package 101 may include a base film 110, first wirings 120, a protection layer 140, a bump 150, and a semiconductor chip 160. The semiconductor package 101 may also include one or more additional wirings and/or conductive patterns that correspond to the touch sensing structure. For illustrative purposes, the semiconductor package 101 is shown to be substantially the same as in FIGS. 5 and 6 including second conductive pattern 172 and third wiring(s) 132.

The semiconductor package 101 may be disposed to electrically connect the circuit substrate 20 and the front face 10a of the display panel 10. That is, an end of one or more first wirings 120 may be bonded to the front face 10a of the display panel 10 by a first conductive adhesive member 50. An end of one or more other first wirings 120 may be bonded to the circuit substrate 20 by a second conductive adhesive member 60. Accordingly, in one embodiment, the semiconductor package 101 may be bent to surround the side face 10c of the display panel 10.

In this case, a first surface 110a of the base film 110, on which the semiconductor chip 160 is disposed, may face the side face 10c of the display panel 10. A second surface 110b opposing the first surface 110a may directly contact the frame 30. If a portion of the second surface 110b of the base film 110 contacts the frame 30 tightly (e.g., sufficient surface area contact), heat generated in the semiconductor chip 160 may be dissipated through the frame 30. If the portion of the second surface 110b of the base film 110 does not contact the frame 30 at all or with sufficient contact area, heat generated in the semiconductor chip 160 may not be dissipated effectively.

That is, in order to radiate an effective amount of heat from the semiconductor chip 160, the semiconductor package 101 should be properly arranged with respect to the frame 30. If the position of the semiconductor package 101 is misaligned, an amount of heat dissipated may decrease. As a result, operation of the semiconductor chip in the semiconductor package may be adversely affected. According to one simulation result, if the position of the semiconductor package 101 is misaligned by 1 mm, a decrease in heat dissipation of the semiconductor package 101 may be more than about 15%.

The second conductive pattern 172 may be disposed through a hole 111 in the base film 110. A bottom surface of the second conductive pattern 172 may be exposed by an opening of the hole in the second surface 110b of the base film 110. If the portion of the second surface 110b of the base film 110 adjacent to the semiconductor chip 160 contacts the frame 30 as illustrated in FIG. 13, the second conductive pattern 172 may be electrically connected to the frame 30.

On the other hand, if the portion of the second surface 110b of the base film 110 adjacent to the semiconductor chip 160 does not contact the frame 30 as illustrated in area X in FIG. 14, the second conductive pattern 172 may be electrically isolated from the frame 30. Thus, depending on whether or not the second conductive pattern 172 is electrically connected to the frame 30, it may be possible to inspect whether or not the semiconductor package 101 is properly arranged with respect to the frame 30.

In example embodiments, the circuit substrate 20 may include a circuit 21 (e.g., a detector) which can determine whether or not the second conductive patterns 172 electrically contact the frame 30. That is, the circuit 21 may be electrically connected to both of the second conductive patterns 172 through a conductive signal path 22. As shown by the dotted line in FIGS. 13 and 14, the conductive path 22 passes through or adjacent the display panel 10, conductive structures 50 and 60, and one of the surfaces or layers of base film 110 to connect to the second conductive patterns 172. The conductive signal path 22 continues through the second conductive patterns 172 and then through a portion of the frame 30 under semiconductor chip 160 to form a closed-circuit configuration.

The detector 21 may determine whether the semiconductor package 101 is properly aligned based on a state of the closed-circuit conductive signal path. For example, if both of the second conductive patterns 172 contacts the frame 30 as shown in FIG. 13, the detector 21 may detect that there is not break in the closed-circuit path 2. As a result, the semiconductor package 101 may be determined to be properly aligned and the heat generated in the semiconductor chip 160 may be dissipated through the frame 30 effectively.

Conversely, if one of the second conductive patterns 172 does not contact the frame 30 as shown in FIG. 14, the detector 21 may detect that there is a break in the closed-circuit path 22. Detecting this break provides an indication that the semiconductor package 101 is misaligned with respect to the frame 30 and that heat dissipation will not be effective. When a misalignment is detected, the semiconductor package 101 may be reassembled to a position where both of the second conductive patterns 172 contact the frame 30, to thereby ensure that sufficient heat dissipation exists.

Alternatively, or additionally, the circuit 21 may be electrically connected through third wiring 132, which may be connected to each of the second conductive patterns 172, for example, in the manner shown in FIGS. 5 and 6. The second conductive pattern 172 may traverse a path adjacent (e.g., parallel) to the first wirings 120 along base film 110, in order to establish an electrical connection between circuit 21 and second conductive pattern 172.

Figure 15:
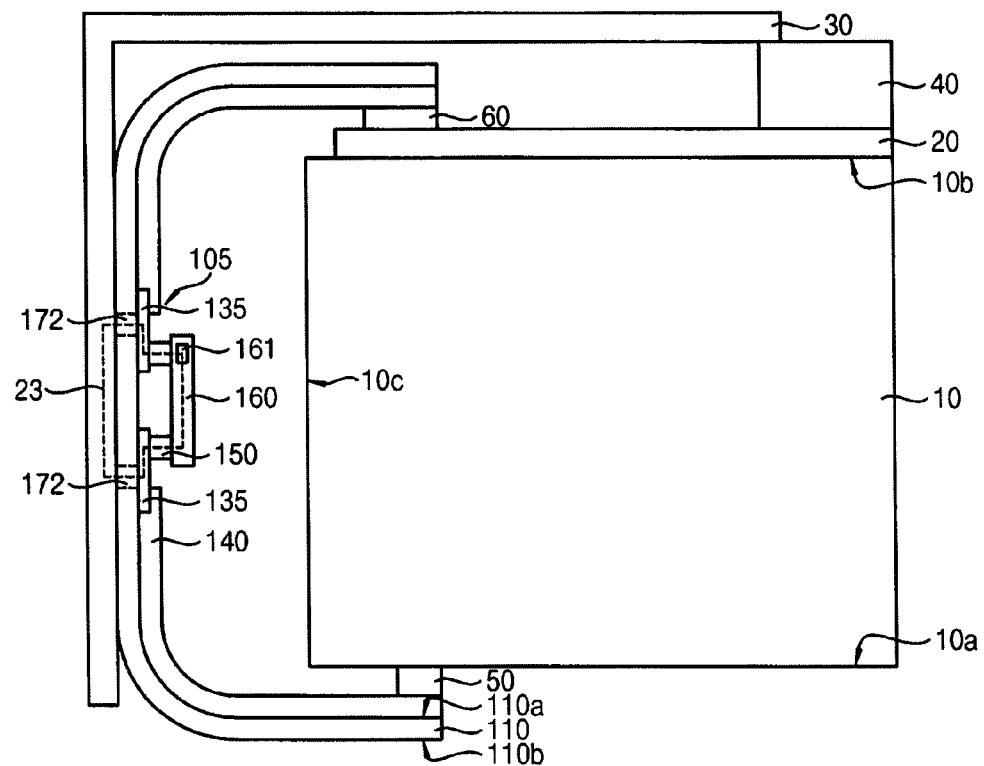
FIG. 15 shows another embodiment a display apparatus.

In accordance with another embodiment shown in FIG. 15, the semiconductor chip 160 includes a detector 161. This detector 161 determines whether a break exists in a closed-circuit conductive path 23. This path 23 extends through the semiconductor chip 160, conductive bumps 150, conductive pads 135, and second conductive patterns 172, and finally through a portion of frame 30 located under the semiconductor chip 160. When the detector 161 detects no break in the conductive path 23, the semiconductor package 101 is determined to be properly aligned for effective heat dissipation. When the detector 161 detects a break in the conductive path 23, the semiconductor package 101 is determined to be misaligned for effective heat dissipation.

In other embodiments, the semiconductor package may be substantially the same as the semiconductor package 100 illustrated with reference to FIGS. 1 to 4, the semiconductor package 102 illustrated with reference to FIG. 7, the semiconductor package 103 illustrated with reference to FIGS. 8 and 9, the semiconductor package 104 illustrated with reference to FIGS. 10 and 11, or the semiconductor package 105 illustrated with reference to FIG. 12.

According to example embodiments, the display apparatus may include the display panel 10, the frame 30 surrounding the display panel 10, and the semiconductor package 101 contacting the frame 30. The semiconductor package 101 may include the touch sensing structure that may determine whether or not the second surface 110b of the base film 110 contacts the frame 30. The portion of the second surface 110b of the base film 110 contacts the frame 30 tightly, so that heat generated in the semiconductor chip 160 may be dissipated through the frame 30.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a flexible base film having a first surface opposing a second surface;
a semiconductor chip mounted on the first surface of the base film; and
a touch sensing structure including at least one conductive pattern adjacent to the semiconductor chip, the at least one conductive pattern being disposed through the base film and having a surface exposed at the second surface of the base film.

2. The semiconductor package as claimed in claim 1, wherein the touch sensing structure is included in an electrical path that determines whether or not the base film contacts a conductive frame supporting the semiconductor package.

3. The semiconductor package as claimed in claim 2, wherein the touch sensing structure includes at least one wire on the first surface of the base film, and wherein the at least one wire electrically contacts the at least one conductive pattern.

4. The semiconductor package as claimed in claim 3, further comprising:
a detector circuit electrically connected to the at least one wire,
wherein the detector circuit determines whether the at least one wire, the conductive pattern, and the frame form a conductive path in order to determine a contact condition between the base film and the frame.

5. The semiconductor package as claimed in claim 2, wherein the touch sensing structure includes a pad on the first surface of the base film, and wherein the pad is electrically connected to the at least one conductive pattern.

6. The semiconductor package as claimed in claim 5, wherein:

the pad is electrically connected to the semiconductor chip, and the semiconductor chip determines whether or not the pad, the at least one conductive pattern, and the frame form a conductive path in order to determine a contact condition between the base film and the frame.

7. The semiconductor package as claimed in claim 1, wherein:

the touch sensing structure includes at least two conductive patterns symmetrically disposed relative to the semiconductor chip, and the at least two conductive patterns are disposed through the base film and have surfaces exposed at the second surface of the base film.

8. The semiconductor package as claimed in claim 1, further comprising:

a heat sink disposed through the base film and under the semiconductor chip.

9. The semiconductor package as claimed in claim 1, wherein the touch sensing structure determines whether or not a portion of the second surface of the base film adjacent to the semiconductor chip contacts a conductive material.

10. A display apparatus, comprising:

a display panel having a front face, a rear face, and a side face;

a semiconductor package at least partially surrounding the side face of the display apparatus and contacting the front face and the rear face of the display panel; and a frame surrounding the rear face and the side face of the display panel and covering the semiconductor package;

wherein the semiconductor package comprises:

a flexible base film having a first surface opposing a second surface;

a semiconductor chip on the first surface of the base film; and a touch sensing structure including at least one conductive pattern disposed adjacent to the semiconductor chip, the at least one conductive pattern being disposed through the base film and having a surface exposed at the second surface of the base film, wherein the touch sensing structure determines whether or not a portion of the second surface of the base film adjacent to the semiconductor chip contacts the frame.

11. The display apparatus as claimed in claim 10, further comprising:

a detector circuit on the rear face of the display panel, wherein the touch sensing structure is electrically connected to the detector circuit by a wire.

12. The display apparatus as claimed in claim 11, wherein the detector circuit determines whether or not the wire, the at least one conductive pattern, and the frame form a conductive path in other to determine a contact condition between the base film and the frame.

13. The display apparatus as claimed in claim 10, wherein the touch sensing structure further includes a pad on the first surface of the base film, and wherein the pad is electrically connected to the at least one conductive pattern.

14. The display apparatus as claimed in claim 13, wherein:

the pad is electrically connected to the semiconductor chip, and the semiconductor chip determines whether or not the pad, the at least one conductive pattern, and the frame form a conductive path in order to determine a contact condition between the base film and the frame.

15. The display apparatus as claimed in claim 10, wherein the semiconductor package further includes a wire on the first surface of the base film, and wherein the semiconductor chip is electrically connected to the display panel along a conductive path that includes the first wire.

16. A semiconductor package, comprising:

a base;

a chip coupled to the base; and a first touch sensor structure adjacent the chip including a first conductor arranged relative to a bottom surface of the base; and a second touch sensor structure adjacent the chip including a second conductor arranged relative to the bottom surface of the base, wherein the first and second conductors are adjacent respective sides of the chip and wherein the first and second conductors are included in electrical paths that provide an indication of a contact condition between the semiconductor package and a conductive support of the semiconductor package.

17. The semiconductor package as claimed in claim 16, wherein:

the first and second conductors are spaced by a distance, and the distance corresponds to an amount of heat to be dissipated from the chip.

18. The semiconductor package as claimed in claim 16, further comprising:

a detector adjacent the chip, the detector to detect the contact condition based on a state of the electrical paths including the first and second conductors.

19. The semiconductor package as claimed in claim 16, wherein:

a contact condition of a first side of the semiconductor package is determined based on a contact condition of the electrical path including the first conductor; and a contact condition of a second side of the semiconductor package is determined based on a contact condition of the electrical path including the second conductor.

20. The semiconductor package as claimed in claim 16, wherein:

the first conductor is coupled to a first tab of the chip, and the second conductor is coupled to a second tab of the chip.

* * * * *